(12) United States Patent
Sakuragi

(10) Patent No.: US 10,425,600 B2
(45) Date of Patent: Sep. 24, 2019

(54) SOLID STATE IMAGING DEVICE

(71) Applicant: CANON KABUSHIKI KAISHA, Tokyo (JP)

(72) Inventor: Takamasa Sakuragi, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 116 days.

(21) Appl. No.: 15/862,020

(22) Filed: Jan. 4, 2018

(65) Prior Publication Data

US 2018/0220089 A1 Aug. 2, 2018

(30) Foreign Application Priority Data

Jan. 30, 2017 (JP) .................. 2017-014651

(51) Int. Cl.
*H04N 5/357* (2011.01)
*H04N 5/365* (2011.01)
*H04N 5/369* (2011.01)
*H04N 5/374* (2011.01)
*H01L 27/146* (2006.01)
*H04N 5/3745* (2011.01)

(52) U.S. Cl.
CPC ..... *H04N 5/3577* (2013.01); *H01L 27/14634* (2013.01); *H01L 27/14636* (2013.01); *H04N 5/3651* (2013.01); *H04N 5/3658* (2013.01); *H04N 5/379* (2018.08); *H04N 5/3742* (2013.01); *H04N 5/37457* (2013.01)

(58) Field of Classification Search
CPC combination set(s) only.
See application file for complete search history.

(56) References Cited

U.S. PATENT DOCUMENTS

| | | |
|---|---|---|
| 7,023,482 B2 | 4/2006 | Sakuragi |
| 8,278,613 B2 | 10/2012 | Okita et al. |
| 8,638,384 B2 | 1/2014 | Sakuragi |
| 8,884,864 B2 | 11/2014 | Sakuragi |
| 9,635,297 B2 | 4/2017 | Sakuragi |
| 9,667,892 B2 | 5/2017 | Sakuragi |
| 2012/0043454 A1 | 2/2012 | Sakuragi |
| 2015/0326812 A1 | 11/2015 | Sakuragi |
| 2016/0014356 A1* | 1/2016 | Sakuragi .............. H04N 5/3577 |
| | | 250/208.1 |

(Continued)

FOREIGN PATENT DOCUMENTS

JP 2016-105571 A 6/2016

*Primary Examiner* — Alexander Gee
(74) *Attorney, Agent, or Firm* — Venable LLP

(57) ABSTRACT

Provided is a solid state imaging device including: pixels arranged in a first direction and provided in a pixel well region, each of the pixels including a photoelectric conversion element and a pixel output unit configured to output a pixel signal based on a signal generated by the photoelectric conversion element; a first wiring connected to the pixel output unit of each of the pixels and arranged extending in the first direction; a second wiring arranged extending in a direction corresponding to the first direction; a third wiring connected to the second wiring at a connection portion located inside the pixel well region in a planar view; and a differential amplification circuit having two input terminals. The pixel signal is input to one of the input terminals via the first wiring, and a potential of the third wiring is input to the other of the input terminals.

20 Claims, 7 Drawing Sheets

(56) References Cited

U.S. PATENT DOCUMENTS

| | | |
|---|---|---|
| 2016/0150176 A1 | 5/2016 | Hiyama et al. |
| 2017/0048475 A1 | 2/2017 | Sakuragi |
| 2017/0078603 A1 | 3/2017 | Yamasaki et al. |
| 2017/0099448 A1 | 4/2017 | Minowa et al. |
| 2017/0244918 A1 | 8/2017 | Sakuragi |

* cited by examiner

SOLID STATE IMAGING DEVICE

BACKGROUND OF THE INVENTION

Field of the Invention

The present invention relates to a solid state imaging device.

Description of the Related Art

Solid state imaging devices such as a CCD sensor, a CMOS sensor, or the like are mounted in imaging systems such as a video camera, surveillance camera, or the like, and such a solid state imaging device may be used under various environments and therefore exposed in an electric field and a magnetic field occurring under the environment. When a magnetic field affects a solid state imaging device, a magnetic induction voltage due to the Faraday's law of induction occurs on a wiring inside the solid state imaging device, which may cause deterioration of image quality. Thus, there is a demand for a technology of measures against magnetic noise to reduce the influence of an electromagnetic field.

Japanese Patent Application Laid-Open No. 2016-105571 discloses a technology in which an external connection terminal which supplies a power source voltage and an external connection terminal which supplies a reference voltage are arranged on the same side of a pixel region and thereby the area of a loop which an external magnetic field enters is decreased to reduce a noise due to an external magnetic field.

However, a demand for a higher performance of solid state imaging devices, a change in the usage environment of solid state imaging devices, or the like may involve a need for further measures against magnetic noise. Thus, there is a demand for a scheme of effective reduction of a noise due to an external magnetic field.

SUMMARY OF THE INVENTION

A solid state imaging device according to one aspect of the present invention includes: pixels arranged in a first direction and provided in a pixel well region, each of the pixels including a photoelectric conversion element and a pixel output unit configured to output a pixel signal based on a signal generated by the photoelectric conversion element; a first wiring connected to the pixel output unit of each of the pixels and arranged extending in the first direction; a second wiring arranged extending in a direction corresponding to the first direction; a third wiring connected to the second wiring at a connection portion located inside the pixel well region in a planar view; and a differential amplification circuit having two input terminals. The pixel signal is input to one of the input terminals via the first wiring, and a potential of the third wiring is input to the other of the input terminals.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. Components having a common function are labeled with the same reference symbol throughout a plurality of drawings, and the description thereof may be simplified or omitted.

First Embodiment

Figure 1A:
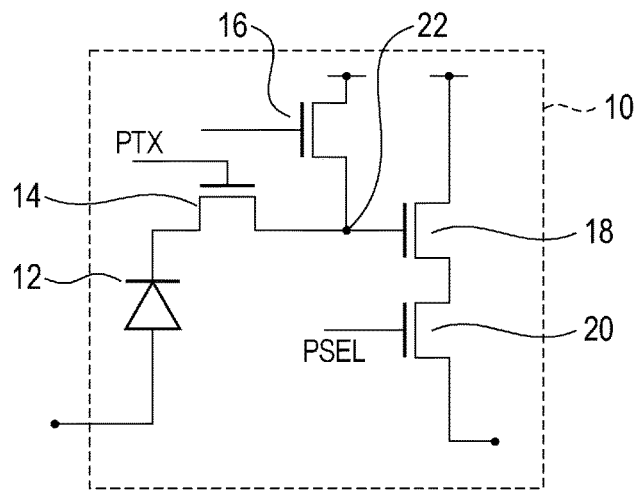
FIG. 1A and FIG. 1B are circuit diagrams of a solid state imaging device according to a first embodiment of the present invention.
Figure 1B:
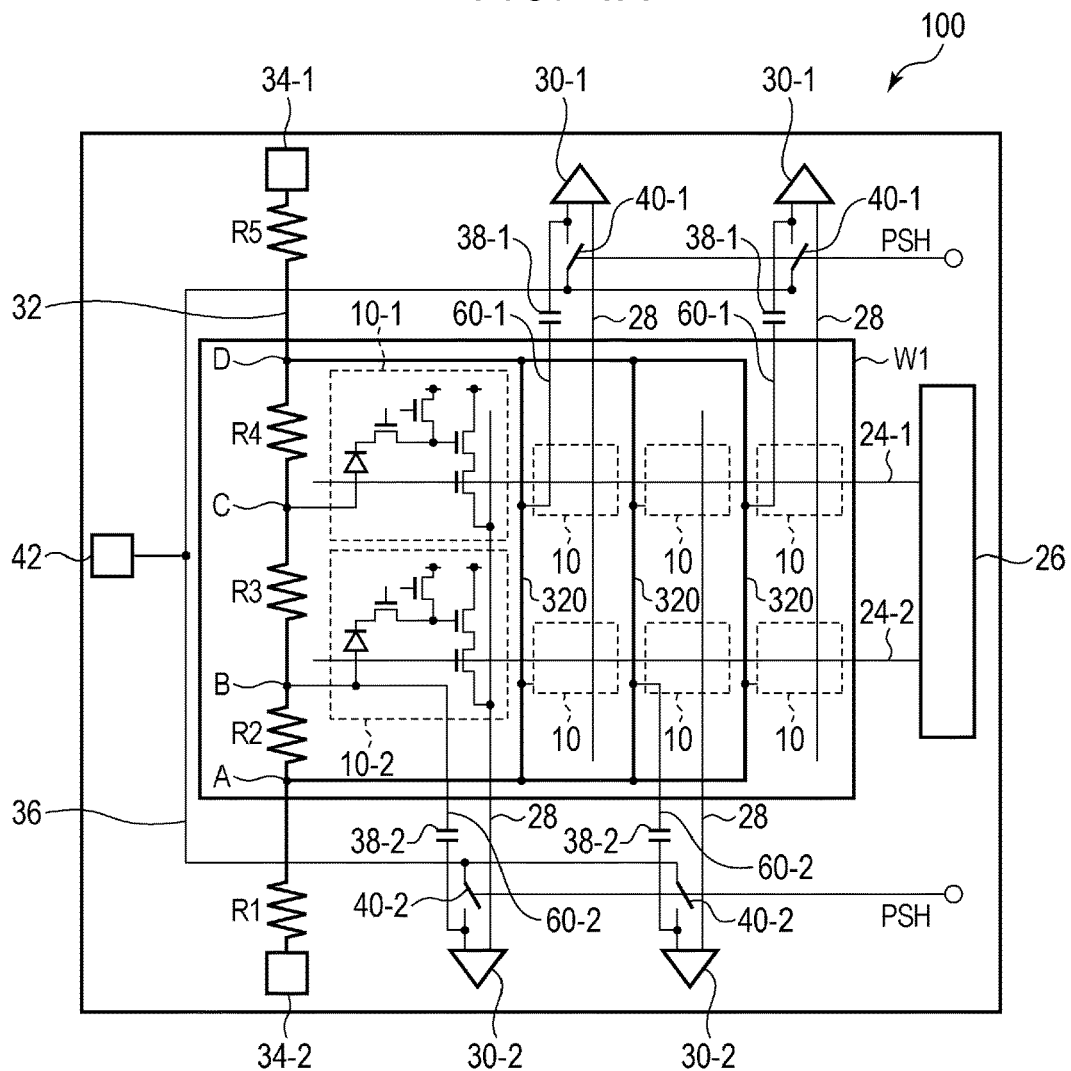

FIG. 1A and FIG. 1B are circuit diagrams of a solid state imaging device 100 according to a first embodiment. FIG. 1A is a circuit diagram of a pixel 10 included in the solid state imaging device 100, and FIG. 1B is a circuit diagram of the solid state imaging device 100 including a pixel array in which the pixels 10 are arranged in the row direction and the column direction and a readout circuit.

The pixels 10 are arranged in a pixel well region W1. As illustrated in FIG. 1A, each of the pixels 10 has a photodiode 12, which is a photoelectric conversion element, a transfer MOS transistor 14, a reset MOS transistor 16, an amplification MOS transistor 18, and a selection MOS transistor 20. The cathode of the photodiode 12 is connected to the source of the transfer MOS transistor 14. The drain of the transfer MOS transistor 14 is connected to the source of the reset MOS transistor 16 and the gate of the amplification MOS transistor 18. The connection node of the drain of the transfer MOS transistor 14, the source of the reset MOS transistor 16, and the gate of the amplification MOS transistor 18 forms a floating diffusion region (hereafter, referred to as "FD region") 22. The drains of the reset MOS transistor 16 and the amplification MOS transistor 18 are connected to a power source voltage line. The source of the amplification MOS transistor 18 is connected to the drain of the selection MOS transistor 20. The transfer MOS transistor 14, the reset MOS transistor 16, the amplification MOS transistor 18, and the selection MOS transistor 20 form an in-pixel readout circuit for reading out a pixel signal based on charges generated by the photodiode 12. The selection MOS transistor 20 is a pixel output unit that outputs a pixel signal based on a signal generated by the photoelectric conversion element.

Note that the names of the source and the drain of a transistor may be different in accordance with the conduction type, a function in interest, or the like of a transistor and thus the source and the drain described above may be referred by the opposite names. Further, a transistor may be denoted as a switch in the present specification.

As illustrated in FIG. 1B, the solid state imaging device 100 according to the present embodiment has a pixel region including a pixel array in which a plurality of pixels 10 are arranged in a two-dimensional manner in the row direction and the column direction. In FIG. 1B, while a pixel region including a pixel array of two rows by four columns is depicted for simplifying the drawing, the number of rows and the number of columns of the pixel array are not limited thereto. Note that, in the present specification, the row direction represents the horizontal direction in the drawings and the column direction represents a vertical direction in the drawings. Further, the column direction may be called a first direction, and the row direction is called a second direction. In an example, the row direction corresponds to the horizontal direction in the solid state imaging device 100, and the column direction corresponds to the vertical direction in the solid state imaging device 100.

Row selection signal lines 24 are arranged extending in the row direction on respective rows of the pixel array. Each of the row selection signal lines 24 is connected to the gate of the selection MOS transistor 20 of each of the pixels 10 aligned in the row direction and forms a signal line common to these pixels 10. Note that, in FIG. 1B, for the purpose of illustration provided later, the row selection signal line 24 connected to the pixels 10 on a row to which the pixel 10-1 belongs is denoted as a row selection signal line 24-1, and the row selection signal line 24 connected to the pixels 10 on a row to which the pixel 10-2 belongs is denoted as a row selection signal line 24-2.

The row selection signal lines 24 are connected to a vertical shift resistor 26. A selection pulse signal PSEL for driving the selection MOS transistors 20 is output to the row selection signal line 24 from the vertical shift resistor 26. In this example, when a High level (hereafter, referred to as "H-level") signal is applied to the row selection signal line 24, the selection MOS transistors 20 enter a conduction state (an on-state). Also, when a Low level (hereafter, referred to as "L-level") signal is applied to the row selection signal line 24, the selection MOS transistors 20 enter a non-conduction state (an off-state). Note that, when the selection pulse signal PSEL applied to the row selection signal line 24-1 and the selection pulse signal PSEL applied to the row selection signal line 24-2 are distinguished from each other, the former is denoted as a selection pulse signal PSEL1, and the latter is denoted as a selection pulse signal PSEL2.

The vertical signal lines 28 (first wiring) are arranged extending in the column direction on respective columns of the pixel array. Each of the vertical signal lines 28 is connected to the source of the selection MOS transistor 20 of each of the pixels 10 aligned in the column direction and forms a signal line common to these pixels 10. One end of each vertical signal line 28 is connected to one of the input terminals of each differential amplifier circuit 30 forming a part of the readout circuit. Thereby, a pixel signal is input to one of the input terminals of the differential amplifier circuit 30 via the vertical signal line 28. Note that, for the purpose of illustration provided later, the differential amplifier circuits 30 connected to the pixels 10 on the even-numbered columns are denoted as differential amplifier circuits 30-1, and the differential amplifier circuits 30 connected to the pixels 10 on the odd-numbered columns are denoted as differential amplifier circuits 30-2.

Further, ground wirings 32 (second wiring) are arranged on respective columns of the pixel array such that at least a part of the ground wiring 32 runs along the pixels 10 aligned in the column direction. The ground wiring 32 is connected to the anode of the photodiode 12 of each of the pixels 10 aligned in the column direction. This connection node on the ground wiring 32 may be called a connection portion. More specifically, the anode of the photodiode 12 of the pixel 10-1 is connected to the ground wiring 32 at a row position C, and the anode of the photodiode 12 of the pixel 10-2 is connected to the ground wiring 32 at a row position B. That is, as illustrated in FIG. 1B, the connection portions are nodes on the ground wiring 32 at row positions adjacent to a plurality of pixels 10 aligned in the column direction, for example, the nodes on the ground wirings 32 each between a plurality of pixels 10 aligned in the row direction. The ground wiring 32 supplies a potential to be a reference of a pixel signal from each connection portion to the anode of each of the photodiodes 12 of the plurality of pixels 10 aligned in the column direction.

Both ends of at least one of the ground wirings 32 provided to corresponding columns extend to the edge portions of a chip and are connected to a plurality of ground pads 34 arranged on the edge portions of the chip. FIG. 1B illustrates an example in which the ground pads 34 are connected to portions on the extension line of the ground wiring 32 connected to the pixels 10-1 and 10-2. In FIG. 1B, for the purpose of illustration provided later, the upper ground pad 34 in the drawing is denoted as a ground pad 34-1 (a first pad), and the lower ground pad 34 in the drawing is denoted as a ground pad 34-2 (a second pad). The ground pad 34-1 and the ground pad 34-2 are arranged on two opposing sides of the chip. The connection portions to which the anodes of the photodiodes 12 of the pixels 10 aligned in the column direction are connected are on an electrical path between the ground pad 34-1 and the ground pad 34-2. Thereby, for the reason described later, a ground loop including the ground wirings 32 may be formed resulting in the structure which may be significantly affected by an external magnetic field.

The ground wrings 32 provided on respective columns of the pixel array are electrically connected to each other. In the example illustrated in FIG. 1B, the ground wirings 32 form a mesh as a whole in which the pixels 10 of the pixel array are surrounded by respective columns. The branch portion of a meshed portion and a portion extending to the ground pad 34-1 of the ground wirings 32 is denoted as a row position D, and the branched portion of a meshed portion and a portion extending to the ground pad 34-2 of the ground wirings 32 is denoted as a row position A. Further, in the mesh-like ground wirings 32, wirings each extending in the direction in which the vertical signal lines 28 extend are denoted as the ground wirings 320. Each of connection lines 60-1 (an example of third wirings) is connected to the ground wiring 320 on the row position C located inside the pixel well region W1 in a planar view. Further, each of connection lines 60-2 (an example of third wirings) is connected to the ground wiring 320 on the row position B located inside the pixel well region W1 in a planar view. Each of the connection lines 60-1 and 60-2 is a wiring connecting the ground wiring 32 to the differential amplifier circuit 30. It can be said that a connection portion that connects the ground wiring 320 to the connection line 60 is provided on each of the row position B and the row position C.

In FIG. 1B, for the purpose of illustration provided later, wiring resistances R1, R2, R3, R4, and R5 are to illustrate wiring resistances occurring on the ground wiring 32 as concentration equivalent resistors. That is, the wiring resistance between the ground pad 34-2 and the row position A is the wiring resistance R1, the wiring resistance between the row position A and the row position B is the wiring resistance R2, the wiring resistance between the row position B and the row position C is the wiring resistance R3, the wiring resistance between the row position C and the row position D is the wiring resistance R4, and the wiring resistance between the row position D and the ground pad 34-1 is the wiring resistance R5.

Further, the other input terminal of each of the differential amplifier circuits 30 is connected to a sample-and-hold circuit including a holding capacitor 38 and a switch 40. This sample-and-hold circuit holds the reference voltage and inputs the reference voltage to the other input terminal of the differential amplifier circuit 30. In FIG. 1B, for the purpose of illustration provided later, the holding capacitors 38 and the switches 40 on the upper side in the drawings are denoted as the holding capacitors 38-1 and the switches 40-1, and the holding capacitors 38 and the switches 40 on the lower side in the drawings are denoted as the holding capacitors 38-2 and the switches 40-2. One of the terminals of the holding capacitor 38-1 is connected to the ground wiring 32 on the row position C where the pixel 10-1 is arranged. One of the terminals of the holding capacitor 38-2 is connected to the ground wiring 32 on the row position B where the pixel 10-2 is arranged. One of the terminal of the switch 40-1 and one of the terminal of the switch 40-2 are connected to a reference voltage wiring 36. The reference voltage wiring 36 extends to the edge portions of the chip and connected to a reference voltage pad 42 arranged on the edge portion of the chip. The other terminal of the holding capacitor 38-1 and the other terminal of the switch 40-1 are connected to the other input terminal of the differential amplifier circuit 30-1. The other terminal of the holding capacitor 38-2 and the other terminal of the switch 40-2 are connected to the other input terminal of the differential amplifier circuit 30-2.

The switch 40 is configured to supply, to the other terminal of the holding capacitor 38, a predetermined potential applied to the reference voltage pad 42 in an on-state. Further, the sample-and-hold circuit including the holding capacitor 38 and the switch 40 has a function of causing the holding capacitor 38 to hold a difference between the potential applied to the reference voltage pad 42 and the potential of the connection portion. Note that the switch 40 is controlled into an on-state or an off-state by a pulse signal PSH output from a control circuit (not shown). The control circuit that outputs the pulse signal PSH may be provided inside the solid state imaging device 100 or may be provided outside the solid state imaging device 100. Further, the control circuit that outputs the pulse signal PSH may be integrally formed with the vertical shift resistor 26.

Figure 2:
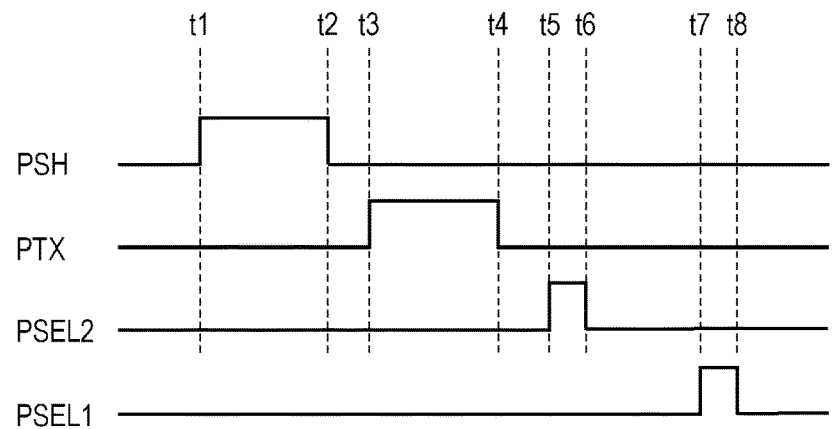
FIG. 2 is a timing diagram of the solid state imaging device according to the first embodiment of the present invention.

FIG. 2 is a timing diagram illustrating a drive method of the solid state imaging device according to the present embodiment. Note that operations characterizing the present invention will be mainly illustrated in the following description, and the description of operations to which known technologies can be applied, such as a reset operation of the photodiode 12 and the FD region 22, an operation of the readout circuit performed after the operation of the differential amplifier circuit 30, or the like will be omitted as appropriate.

The potential applied to the reference voltage pad 42 is supplied via the reference voltage wiring 36 to the sample-and-hold circuits each formed of the holding capacitor 38 and the switch 40. In a period from the time t1 to the time t2, a H-level pulse signal PSH is applied to the gates of the switches 40-1 and 40-2. Thereby, the reference voltage is held in the holding capacitors 38-1 and 38-2, each held reference voltage is input to the other input terminal of each of the differential amplifier circuits 30. Since one of the terminals of the holding capacitor 38-1 is connected to the node on the row position C, the reference voltage held in the holding capacitor 38-1 is a reference voltage whose reference is the potential on the row position C. Also, since one of the terminals of the holding capacitor 38-2 is connected to the node on the row position B, the reference voltage held in the holding capacitor 38-2 is a reference voltage whose reference is the potential at the row position B. In such a way, the reference voltage whose reference is the potential of the connection portion on the ground wiring 32 connected with the photodiode 12 of one of the pixels 10 is input to the other input terminal of the differential amplifier circuit 30.

Further, in a time before the time t3, a light (an optical image of a subject) is caused to enter the solid state imaging device 100. Thereby, signal charges are generated by photoelectric conversion in the photodiode 12 of each of the pixels 10.

In a period from the time t3 to the time t4, the vertical shift resistor 26 applies a H-level transfer pulse signal PTX to the gate of the transfer MOS transistor 14. Thereby, the transfer MOS transistor 14 enters an on-state, and signal charges generated by the photodiode 12 are transferred to the FD region 22.

Note that the transfer MOS transistor 14 on the row to which the pixel 10-2 belongs and the transfer MOS transistor 14 on the row to which the pixel 10-1 belongs may be driven at the same time by the transfer pulse signal PTX or may be driven in different periods. In the case where these rows are separately driven, the row to which the pixel 10-2 belongs may be driven in a period between the time t1 and the time t2, and the row to which the pixel 10-1 belongs may be driven in a period between the time t6 and the time t7, for example.

Subsequently, in a period from the time t5 to the time t6, the vertical shift resistor 26 applies a H-level selection pulse signal PSEL2 to the row selection signal line 24-2 to cause the selection MOS transistors 20 of the pixels 10 connected to the row selection signal line 24-2 to enter an on-state. Thereby, each output voltage of the amplification MOS transistor 18 based on the potential in accordance with the signal charges transferred to the FD region 22 is output to the vertical signal line 28 via the selection MOS transistor 20. A pixel signal voltage whose reference is the potential of the row at the row position B on the ground wiring 32 is output to the vertical signal line 28 connected to the pixel 10-2. This pixel signal voltage output from the pixel 10-2 is then input to one of the input terminals of the differential amplification circuit 30-2 via the vertical signal line 28.

Thereby, the differential amplification circuit 30-2 then amplifies the differential voltage between the pixel signal voltage input to one of the input terminals thereof on the row to which the pixel 10-2 is arranged and the reference voltage input to the other input terminal and outputs the amplified voltage from the output terminal.

Subsequently, in a period from the time t7 to the time t8, the vertical shift resistor 26 applies a H-level selection pulse signal PSEL1 to the row selection signal line 24-1 to cause the selection MOS transistors 20 of the pixels 10 connected to the row selection signal line 24-1 to enter an on-state. Thereby, each output voltage of the amplification MOS transistor 18 based on the potential in accordance with the signal charges transferred to the FD region 22 is output to the vertical signal line 28 via the selection MOS transistor 20. A pixel signal voltage whose reference is the potential of the row at the row position C on the ground wiring 32 is output to the vertical signal line 28 connected to the pixel 10-1. This pixel signal voltage output from the pixel 10-1 is then input to one of the input terminals of the differential amplification circuit 30-1 via the vertical signal line 28.

Thereby, the differential amplification circuit 30-1 then amplifies the differential voltage between the pixel signal voltage input to one of the input terminals thereof on the row to which the pixel 10-1 is arranged and the reference voltage input to the other input terminal and outputs the amplified voltage from the output terminal.

The reason why the influence of a magnetic induction voltage is reduced in the configuration of the present embodiment will be described below by referring to a period from the time t5 to the time t6 in which the selection pulse signal PSEL2 is a H-level as an example.

Figure 3:
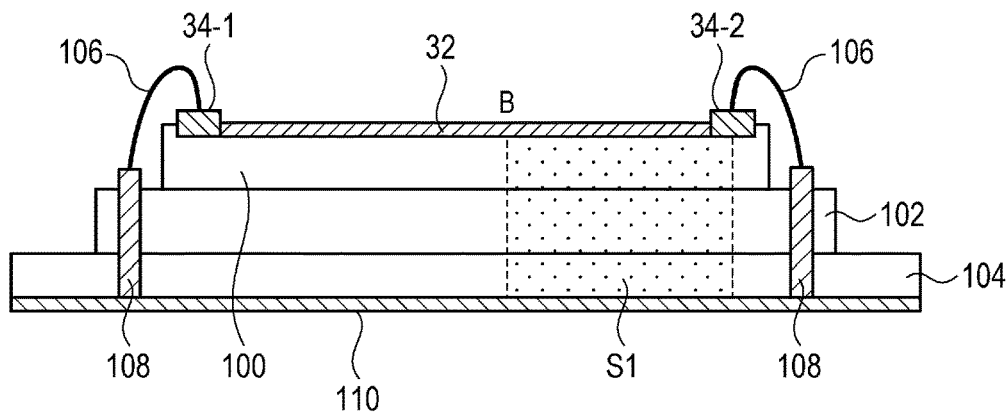
FIG. 3 is a sectional structural drawing of the solid state imaging device according to the first embodiment of the present invention, a package, and an external substrate.

FIG. 3 is a sectional structural drawing including the solid state imaging device 100 according to the first embodiment, a package 102 that holds the solid state imaging device 100, and an external substrate 104 connected with the package 102. The sectional view illustrated in FIG. 3 corresponds to the cross section in the column direction including the ground pad 34 of FIG. 1B when viewed from the left side of the FIG. 1B.

The ground pads 34-1 and 34-2 of the solid state imaging device 100 are connected to an external ground wiring 110 of the external substrate 104 via bonding wires 106 and vias 108 provided in the package 102, as illustrated in FIG. 3. Thereby, a ground loop including the ground wiring 32 and the external ground wiring 110 is formed.

As described above, once a H-level selection pulse signal PSEL2 is applied to the row selection signal line 24-2, the pixel signal voltage from the pixel 10-2 becomes a voltage whose reference is the row position B on the ground wiring 32. Therefore, the region of the ground loop which affects the potential on the row position B of the ground wiring 32 is a region of an area S1 illustrated in FIG. 3.

Assuming that there is an external magnetic field in a direction intersecting the drawing sheet in FIG. 3, the magnetic induction voltage induced onto the ground wiring 32 due to such an external magnetic field is proportional to the area of the ground loop due to the Faraday's law of induction. Therefore, the induced magnetic induction voltage depends on the row position that is the reference of the ground potential. When row positions that provide references of the ground potential are the same, the induced magnetic induction voltages will be the same.

Figure 4:
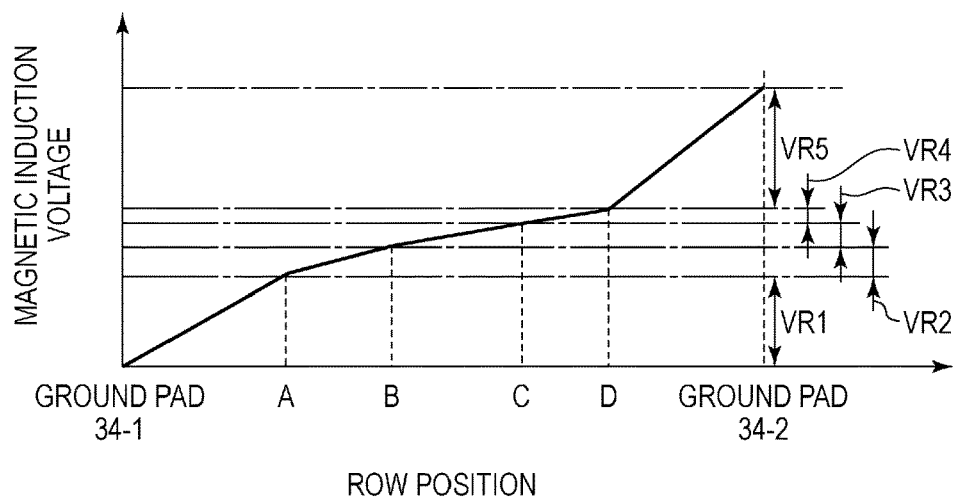
FIG. 4 is a graph illustrating a magnetic induction voltage induced onto a ground wiring.

The magnetic induction voltage induced onto the ground wiring 32 will be described in more detail. FIG. 4 is a graph in which the horizontal axis represents the position from the ground pad 34-1 to the ground pad 34-2 and the vertical axis represents the magnetic induction voltage induced onto the ground wiring 32. As illustrated in FIG. 4, a slope of the potential due to an external magnetic field occurs on the ground wiring 32. The magnetic induction voltages occurring in the wiring resistances R1 to R5 are denoted as the magnetic induction voltages VR1 to VR5, respectively.

In the present embodiment, once the selection pulse signal PSEL2 becomes a H-level and is input to the selection MOS transistor 20 of the pixel 10-2, the pixel 10-2 outputs the pixel signal voltage whose reference is the ground potential on the row position B to the vertical signal line 28. The pixel signal voltage input to one of the input terminals of the differential amplification circuit 30-2 becomes a pixel signal voltage (Vsig+VR1+VR2) (Vsig is an optical signal voltage) whose reference is the magnetic induction voltage (VR1+VR2) associated with the row position B. The reference voltage input to the other input terminal of the differential amplification circuit 30-2 becomes a reference voltage (Vref+VR1+VR2) (Vref is an original reference voltage) whose reference is the magnetic induction voltage (VR1+VR2) associated with the row position B. Therefore, the voltage Vout output from the differential amplification circuit 30-2 is the difference between these voltages, which results in Vout=Vsig−Vref. In such a way, when row positions that provide references of the ground potential are the same as or close to each other, the influence of the magnetic induction voltages are cancelled each other between the pixel signal voltage and the reference voltage. Therefore, according to the configuration of the present embodiment, the influence of the magnetic induction voltage is reduced.

Note that the magnetic induction voltage occurring on the wiring from the row position B to one of the terminals of the holding capacitor 38-2 is substantially the same as the magnetic induction voltage occurring on the vertical signal line 28 and is therefore cancelled by the differential amplification circuit 30-2. Further, even when there is a difference between the magnetic induction voltages, the above wiring does not form a loop, which causes little influence and thus no problem.

Figure 5:
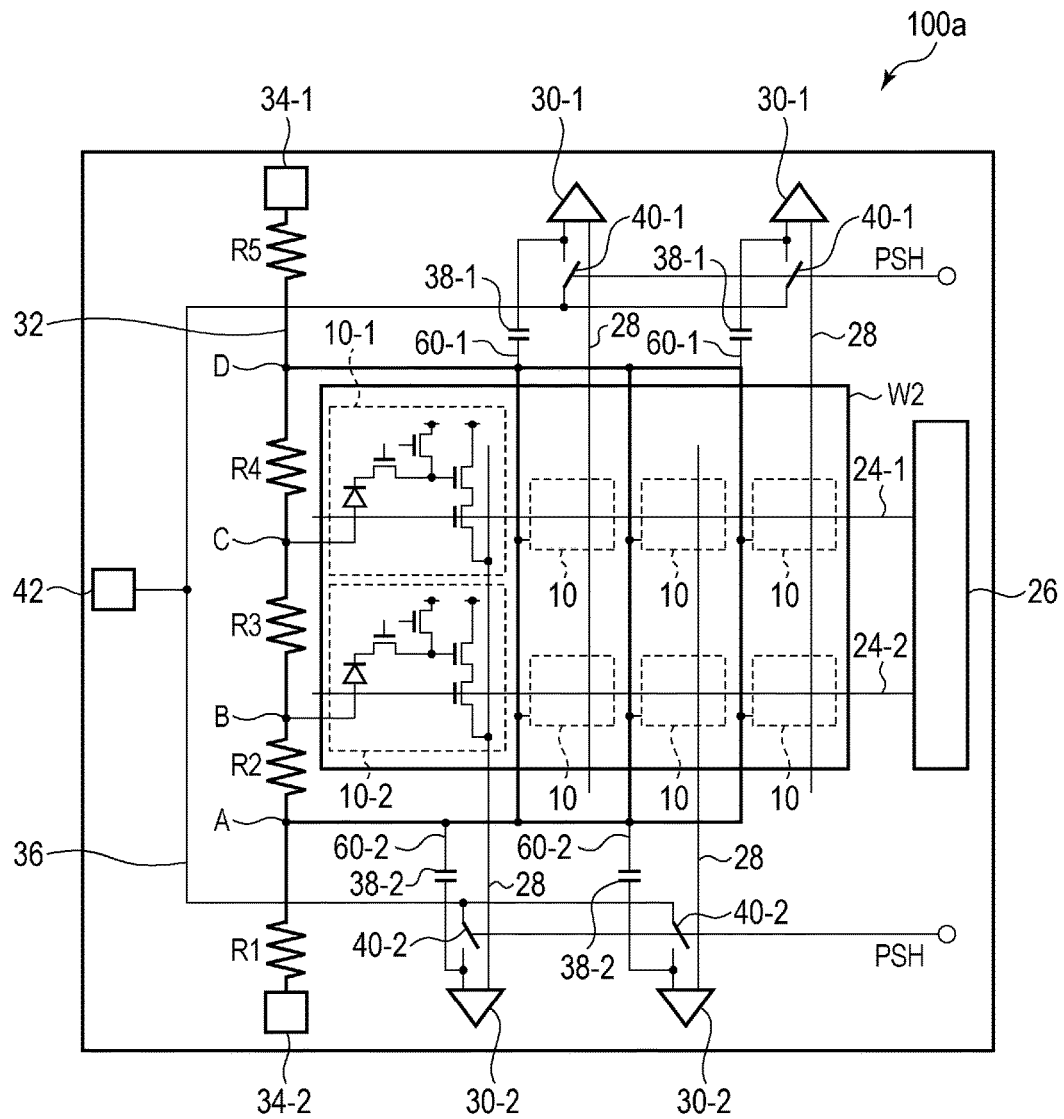
FIG. 5 is a circuit diagram of a solid state imaging device according to a comparative example.

Next, a comparative example to the present embodiment will be described, and the advantages of the present embodiment will be described in detail in comparison to the comparative example. FIG. 5 is a circuit diagram of the solid state imaging device 100a according to the comparative example. FIG. 5 is a circuit diagram of the solid state imaging device 100a including a pixel array and a readout circuit and corresponds to FIG. 1B. Note that, in comparative example, since the configuration of the pixel 10 is the same as that in FIG. 1A, the depiction and description thereof will be omitted. In FIG. 5, the row position A and the row position D are located outside a pixel well region W2. Each of the connection lines 60-1 is connected to the ground wiring 32 on the row position D located outside the pixel well region W2 in a planar view. Also, each of the connection lines 60-2 is connected to the ground wiring 32 on the row position A located outside the pixel well region W2 in a planar view.

In FIG. 5, one of the terminals of the holding capacitor 38-1 is connected to the ground wiring 32 on the row position D, and one of the terminals of the holding capacitor 38-2 is connected to the ground wiring 32 on the row position A. That is, the reference voltage input to the other terminal of the differential amplification circuit 30-1 is a reference voltage whose reference is the voltage of the row position D, and the reference voltage input to the other terminal of the differential amplification circuit 30-2 is a reference voltage whose reference is the voltage of the row position A. In such the comparative example, the reference positions of the reference voltage input to the differential amplification circuits are not located adjacent to the pixels 10. Since other circuit configurations are the same as those in FIG. 1B, the description thereof will be omitted. Further, since the drive method of the solid state imaging device 100a of the comparative example is the same as the drive method illustrated in FIG. 3, the description thereof will be omitted.

Figure 6:
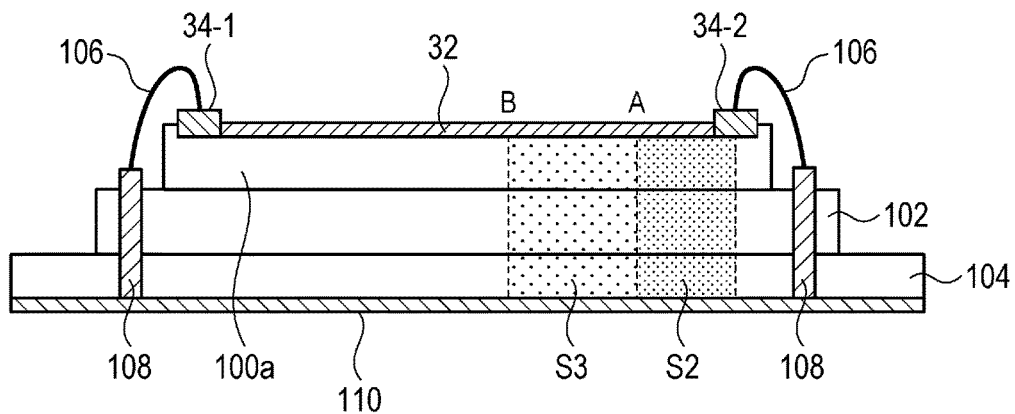
FIG. 6 is a sectional structural drawing of the solid state imaging device according to a comparative example, a package, and an external substrate.

FIG. 6 is a sectional structural drawing including the solid state imaging device 100a according to the comparative example, a package 102 that holds the solid state imaging device 100a, and an external substrate 104 connected with the package 102. Since the sectional configuration of the solid state imaging device 100a is the same as that in FIG. 4, the description thereof will be omitted. In FIG. 6, the magnetic induction voltage induced onto the ground wiring 32 due to such an external magnetic field in a direction intersecting the drawing sheet is proportional to the area of a ground loop due to the Faraday's law of induction. When a H-level selection pulse signal PSEL2 is applied to the row selection signal line 24-2, the pixel signal voltage output from the pixel 10-2 is a voltage whose reference is the row position B on the ground wiring 32. Therefore, the region of a ground loop affecting the potential on the row position B on the ground wiring 32 in this case is a region of an area (S2+S3) illustrated in FIG. 6. On the other hand, since the reference voltage input to the other input terminal of the differential amplification circuit 30-2 is based on the row position A as a reference, a region of a ground loop affecting the reference voltage is a region of an area S2 illustrated in FIG. 6.

In other words, the pixel signal voltage input to one of the input terminals of the differential amplification circuit 30-2 becomes a pixel signal voltage (Vsig+VR1+VR2) (Vsig is an optical signal voltage) whose reference is the magnetic induction voltage (VR1+VR2) associated with the row position B. The reference voltage input to the other input terminal of the differential amplification circuit 30-2 becomes a reference voltage (Vref+VR1) (Vref is an original reference voltage) whose reference is the magnetic induction voltage VR1 associated with the row position A. Therefore, the voltage Vout output from the differential amplification circuit 30-2 is the difference between these voltages, which results in Vout=Vsig−Vref−VR1. As discussed above, in the comparative example, the output signal is affected by the magnetic induction voltage VR1 due to the external magnetic field.

In contrast, in the present embodiment, as described above, since the reference voltage input to the other input terminal of the differential amplification circuit 30-2 is based on the row position B adjacent to the pixels 10 as a reference, the influence of the magnetic induction voltages are cancelled each other and thus the influence of the magnetic induction voltage is reduced. Therefore, according to the present embodiment, a solid state imaging device that can effectively reduce a noise due to an external magnetic field can be provided.

Note that, in the present embodiment, when other pixel than the pixel 10-2 is selected and, for example, when the selection pulse signal PSEL1 is a H-level, the row positions that provide references of the ground potential are different between a pixel signal voltage and a reference voltage input to the differential amplification circuit 30-2. Thus, the magnetic induction voltage is not completely cancelled. However, compared to the case where the row position that provides a reference of the reference voltage is the row position A at the end of the pixel array as illustrated in the comparative example, since the magnetic induction voltage can be reduced, the advantage of reduction of a noise due to an external magnetic field can be obtained even in the above case.

Second Embodiment

Figure 7:
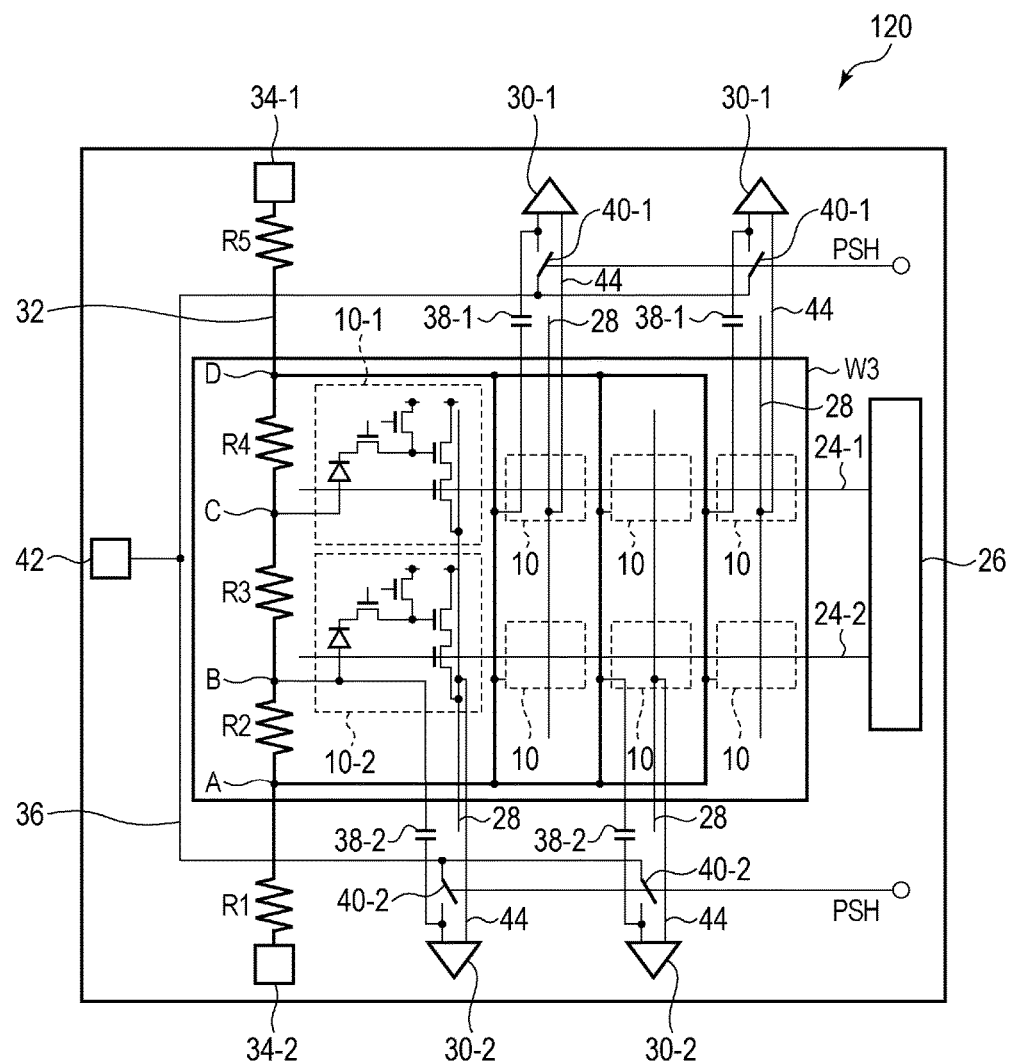
FIG. 7 is a circuit diagram of a solid state imaging device according to a second embodiment of the present invention.

FIG. 7 is a circuit diagram of a solid state imaging device 120 according to a second embodiment. FIG. 7 is a circuit diagram of the solid state imaging device 120 including a pixel array and a readout circuit and corresponds to FIG. 1B of the first embodiment. Since other configurations are the same as those in the first embodiment, the depiction and description thereof will be omitted. The row positions A to D are located inside a pixel well region W3 in a planar view.

In the present embodiment, the wiring form of the wiring from the vertical signal line 28 to the differential amplification circuit 30 is different from that in the first embodiment. The first embodiment does not specify the connection point of the wiring within a pixel and the vertical signal line 28. In contrast, in the present embodiment, each of lead wirings 44 (fourth wirings) input to one of the input terminals of the differential amplification circuit 30-1 is connected to the vertical signal line 28 on the row position C. Further, each of the lead wirings 44 input to one of the input terminals of the differential amplification circuit 30-2 is connected to the vertical signal line 28 on the row position B. Each of these connection nodes may be called a second connection portion. In such a way, in the present embodiment, each connection point of the lead wiring 44 and the vertical signal line 28 matches the row position on which the anode of the photodiode 12 and the other terminal of the holding capacitor 38 are connected to the ground wring 32. In other words, the connection portion and the second connection portion are arranged at positions aligned in the row direction.

The vertical signal lines 28 typically form no loop. Thus, the magnetic induction voltage occurring on the vertical signal line 28 less depends on the row position. When the source of the magnetic field is close to the solid state imaging device 120, however, the influence to the image quality due to the row-position dependency of the magnetic induction voltage occurring on the vertical signal line 28 may not be ignored. In such a case, it is possible to suppress the influence of the row-position dependency of the magnetic induction voltage by causing the row position on which the other terminal of the holding capacitor 38 is connected and the row position on which the vertical signal line 28 is wired to be closer or more preferably to be matched. This allows for a reduction of a noise due to the external magnetic field.

Third Embodiment

Figure 8:
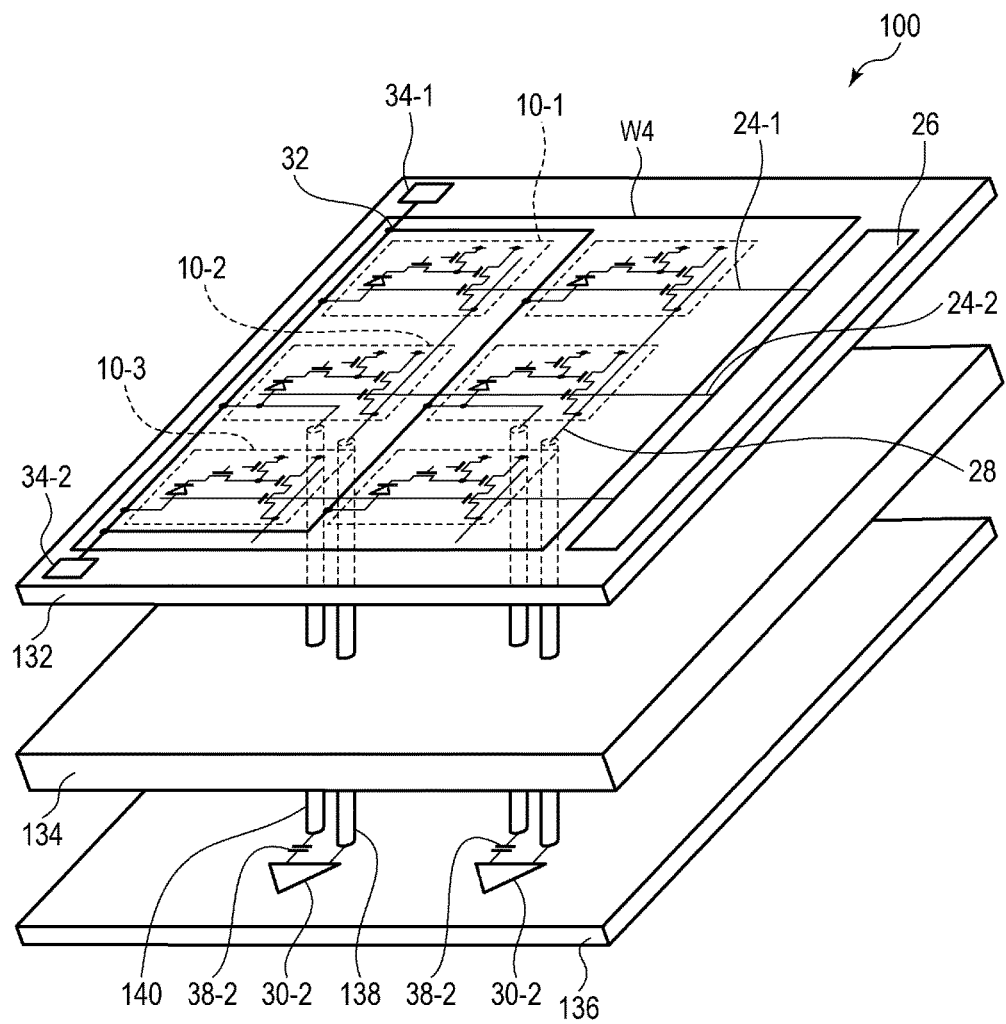
FIG. 8 is a schematic diagram of a solid state imaging device according to a third embodiment of the present invention.

An example of the specific element structure of the solid state imaging device 100 according to the first embodiment will be described as a third embodiment. FIG. 8 is a schematic diagram illustrating the structure of the solid state imaging device 100 according to the third embodiment. Since the circuit configuration is the same as that in FIG. 1A and FIG. 1B, the description thereof will be omitted. Further, in FIG. 8, the depiction of a part of the elements such as the differential amplification circuit 30-1 is omitted. The solid state imaging device 100 has the structure in which a first semiconductor substrate 132, an insulator 134, and a second semiconductor substrate 136 are stacked. The pixels 10, the row selection signal lines 24, the vertical shift resistor 26, the vertical signal lines 28, the ground wirings 32, the ground pads 34, and the like are formed on the first semiconductor substrate 132. The differential amplification circuits 30, holding capacitors 38, and the like are formed on the second semiconductor substrate 136.

The solid state imaging device 100 has first vias 138 and second vias 140 that connect wirings on the first semiconductor substrate 132 to wirings on the second semiconductor substrate 136. Each of the first vias 138 is arranged in an electric path between the vertical signal line 28 and one of the input terminals of the differential amplification circuit 30-2. Each of the second vias 140 is arranged in an electric path between the connection portion on the ground wiring 32 and one of the terminals of the holding capacitor 38-2. The first vias 138 and the second vias 140 are located inside a pixel well region W4 formed in the first semiconductor substrate 132 in a planar view.

As discussed above, in the present embodiment, a more specific configuration of the solid state imaging device 100 having the circuit configuration of the first embodiment has been illustrated. With this configuration, a solid state imaging device that can effectively reduce a noise due to the external magnetic field can be provided as described in the first embodiment. Further, in the present embodiment, the wiring on the first semiconductor substrate 132 and the wiring on the second semiconductor substrate 136 are connected to each other via the first via 138 and the second via 140. This allows for employing the configuration in which the pixels 10 and the like are formed on a semiconductor substrate and the differential amplification circuit 30 and the like are formed on a different semiconductor substrate.

Fourth Embodiment

Figure 9:
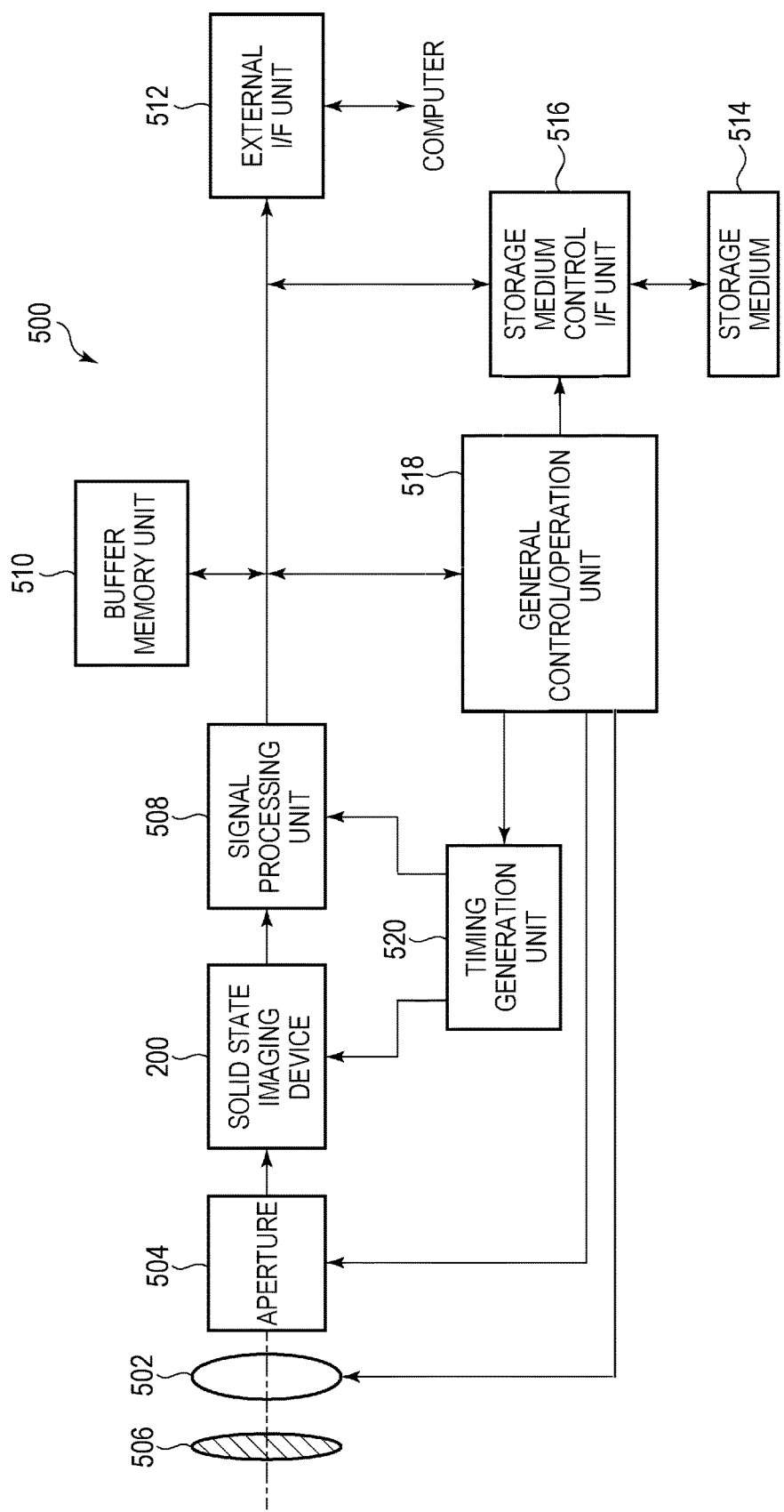
FIG. 9 is a block diagram of an imaging system according to a fourth embodiment of the present invention.

FIG. 9 is a block diagram illustrating the configuration of an imaging system 500 according to the present embodiment. The imaging system 500 of the present embodiment includes a solid state imaging device 200 to which the configuration of any of the solid state imaging devices 100 and 120 described in the above first to third embodiment is applied. A specific example of the imaging system 500 may be a digital still camera, a digital camcorder, a surveillance camera, or the like. FIG. 9 illustrates an example configuration of a digital still camera including the solid state imaging device 200 to which the configuration of any of the first to third embodiments is applied.

The imaging system 500 illustrated in FIG. 9 as an example has the solid state imaging device 200, a lens 502 that causes an optical image of a subject to be captured onto the solid state imaging device 200, an aperture 504 for changing the amount of a light passing through the lens 502, and a barrier 506 for protecting the lens 502. The lens 502 and the aperture 504 form an optical system that converges a light onto the solid state imaging device 200. The solid state imaging device 200 is any of the solid state imaging devices 100 and 120 described in the first to third embodiments.

The imaging system 500 further has a signal processing unit 508 that performs processing of an output signal output from the solid state imaging device 200. The signal processing unit 508 performs signal processing operations of performing, if necessary, various correction and compression on an input signal for output. The signal processing unit 508 may have a function of performing analog-to-digital (AD) conversion process on an output signal output from the solid state imaging device 200. In this case, the AD conversion circuit is not necessarily required to be provided inside the solid state imaging device 200.

The imaging system 500 further has a buffer memory unit 510 for temporarily storing image data and an external interface unit (external I/F unit) 512 for communicating with an external computer or the like. Furthermore, the imaging system 500 has a storage medium 514 such as a semiconductor memory or the like for performing recording or readout of captured data and a storage medium control interface unit (storage medium control I/F unit) 516 for performing recording to or readout from the storage medium 514. Note that the storage medium 514 may be embedded in the imaging system 500 or may be removable.

Furthermore, the imaging system 500 has a general control/operation unit 518 that performs various operation and controls the entire digital still camera and a timing generation unit 520 that outputs various timing signals to the solid state imaging device 200 and the signal processing unit 508. Here, the timing signal or the like may be supplied from the outside, and the imaging system 500 may be any imaging system as long as it has at least the solid state imaging device 200 and the signal processing unit 508 that processes an output signal output from the solid state imaging device 200. The general control/operation unit 518 and the timing generation unit 520 may be configured to perform some or all of the control functions of the solid state imaging device 200.

The solid state imaging device 200 outputs a signal used for an image to the signal processing unit 508. The signal processing unit 508 performs predetermined signal processing on the signal used for an image output from the solid state imaging device 200 to output image data. Further, the signal processing unit 508 uses the signal used for an image to generate an image.

By forming an imaging system using the solid state imaging device 100 or 120 according to the first to third embodiments, an imaging system that can acquire a better quality image can be realized.

Fifth Embodiment

Figure 10A:
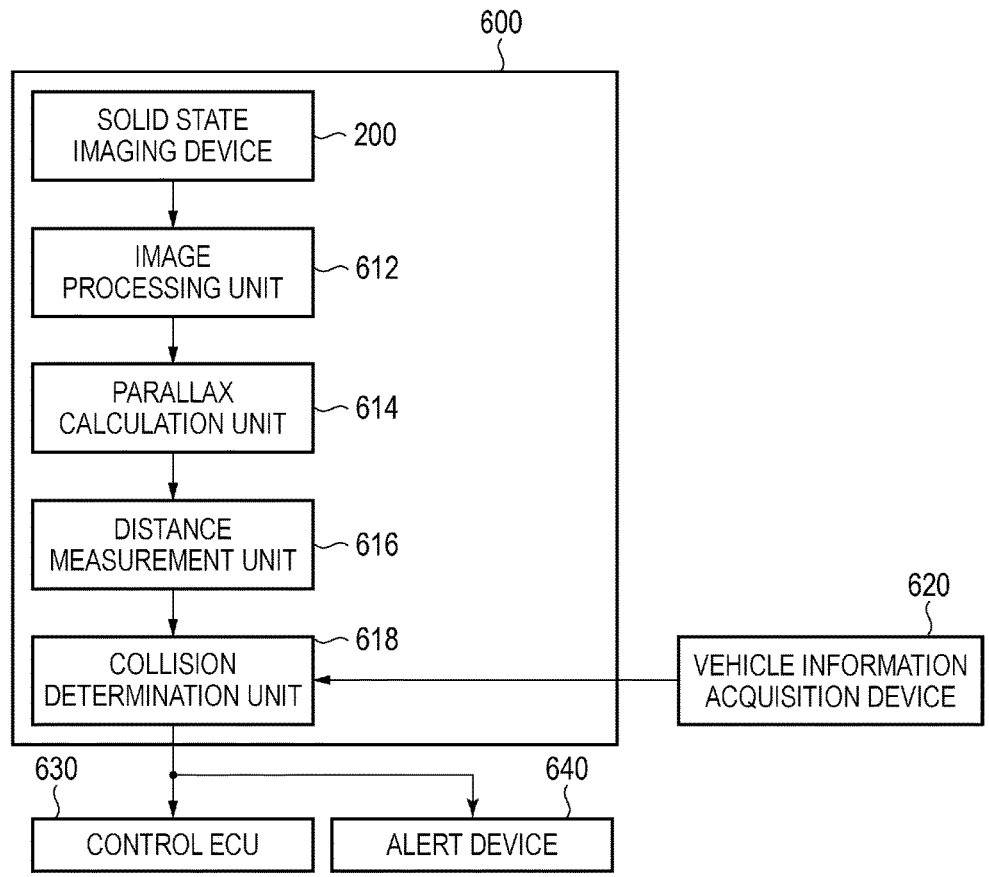
FIG. 10A and FIG. 10B are block diagrams of an imaging system according to a fifth embodiment of the present invention.
Figure 10B:
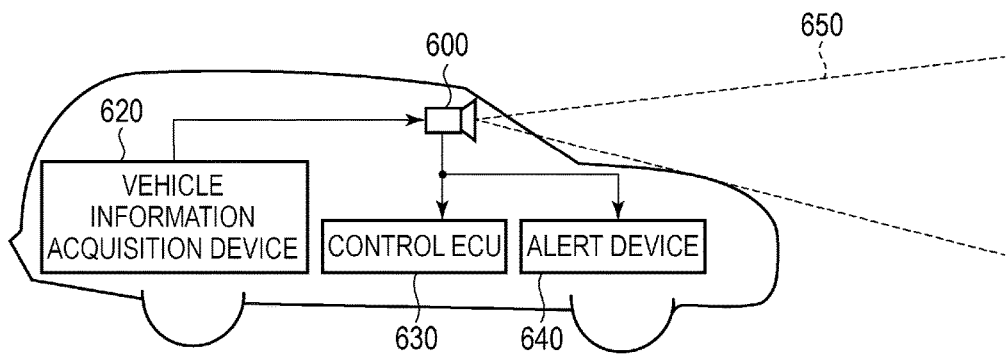

FIG. 10A and FIG. 10B are diagrams illustrating the configuration of an imaging system 600 and a mobile apparatus according to the present embodiment. FIG. 10A illustrates an example of the imaging system 600 for an on-vehicle camera. The imaging system 600 has the solid state imaging device 200. The solid state imaging device 200 is any of the solid state imaging devices 100 and 120 described in the above first to third embodiments. The imaging system 600 has an image processing unit 612 that performs image processing on a plurality of image data acquired by the solid state imaging device 200 and a parallax calculation unit 614 that calculates a parallax (a phase difference of parallax images) from the plurality of image data acquired by the imaging system 600. Further, the imaging system 600 has a distance measurement unit 616 that calculates a distance to the object based on the calculated parallax and a collision determination unit 618 that determines whether or not there is a collision possibility based on the calculated distance. Here, the parallax calculation unit 614 and the distance measurement unit 616 are an example of a distance information acquisition unit that acquires distance information on the distance to the object. That is, the distance information is information regarding a parallax, a defocus amount, a distance to an object, or the like. The collision determination unit 618 may use any of the distance information to determine the collision possibility. The distance information acquisition unit may be implemented by dedicatedly designed hardware or may be implemented by a software module. The distance information acquisition unit may be implemented by a Field Programmable Gate Array (FPGA), an Application Specific Integrated Circuit (ASIC), or the like, or may be implemented by combination thereof.

The imaging system 600 is connected to the vehicle information acquisition device 620 and can acquire vehicle information such as a vehicle speed, a yaw rate, a steering angle, or the like. Further, the imaging system 600 is connected with a control ECU 630, which is a control device that outputs a control signal for causing a vehicle to generate braking force based on a determination result by the collision determination unit 618. That is, the control ECU 630 is an example of a mobile apparatus control unit that controls a mobile apparatus based on distance information. Further, the imaging system 600 is connected with an alert device 640 that issues an alert to the driver based on a determination result by the collision determination unit 618. For example, when the collision probability is high as the determination result of the collision determination unit 618, the control ECU 630 performs vehicle control to avoid a collision or reduce damage by applying a brake, pushing back an accelerator, suppressing engine power, or the like. The alert device 640 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 600. FIG. 10B illustrates the imaging system 600 in a case of capturing a front area of a vehicle (a capturing area 650). The vehicle information acquisition device 620 transmits instructions to operate the imaging system 600 and perform capturing of an image. With a use of the solid state imaging device 100 or 120 according to the first to third embodiments, the imaging system 600 of the present embodiment can further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a mobile apparatus (moving apparatus) such as a ship, an airplane, or an industrial robot, for example. In addition, the imaging system can be widely applied to a device which utilizes object recognition, such as an intelligent transportation system (ITS), without being limited to mobile apparatuses.

Modified Embodiments

All the above-described embodiments merely illustrate embodied examples in implementing the present invention, and the technical scope of the present invention should not be construed in a limiting sense by these examples. That is, the present invention can be implemented in various forms without departing from its technical idea or its primary feature. Further, the embodiments described above can be implemented in various combination thereof.

While the configuration in which the vertical scanning circuit that scans the pixels 10 is the vertical shift resistor 26 has been illustrated as an example in the above-described embodiment, the vertical scanning circuit may be a decoder.

While the specific example configuration of the solid state imaging device 100 has been illustrated in the third embodiment, the specific configuration is not limited thereto. For example, the components illustrated in FIG. 1B may be arranged on one of the semiconductor substrates.

The configuration of the pixel 10 illustrated in FIG. 1A is an example, and the pixel which can be applied to the solid state imaging device of the present invention is not limited thereto.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-014651, filed Jan. 30, 2017, which is hereby incorporated by reference herein in its entirety.

What is claimed is:

1. A solid state imaging device comprising:
   a plurality of pixels arranged in a first direction and provided in a pixel well region, each of the plurality of pixels including a photoelectric conversion element and a pixel output unit configured to output a pixel signal based on a signal generated by the photoelectric conversion element;
   a first wiring connected to the pixel output unit of each of the plurality of pixels and arranged extending in the first direction;
   a second wiring arranged extending in a direction corresponding to the first direction;
   a third wiring connected to the second wiring at a connection portion located inside the pixel well region in a planar view; and
   a differential amplification circuit having two input terminals, wherein the pixel signal is input to one of the input terminals via the first wiring, and a potential of the third wiring is input to the other of the input terminals.

2. The solid state imaging device according to claim 1, wherein the second wiring is connected to the photoelectric conversion element of each of the plurality of pixels, and
   wherein a potential that is a reference of the pixel signal is supplied from the connection portion to the photoelectric conversion element.

3. The solid state imaging device according to claim 1, wherein the plurality of pixels are arranged in a two-dimensional manner in the first direction and a second direction, and
wherein the connection portion is located between the plurality of pixels aligned in the second direction.

4. The solid state imaging device according to claim 2,
wherein the plurality of pixels are arranged in a two-dimensional manner in the first direction and a second direction, and
wherein the connection portion is located between the plurality of pixels aligned in the second direction.

5. The solid state imaging device according to claim 1 further comprising a holding capacitor having two terminals, wherein one of the terminals is connected to the connection portion, and the other of the terminals is connected to the other of the input terminals of the differential amplification circuit, and wherein the third wiring and the other of the input terminals are connected via the holding capacitor.

6. The solid state imaging device according to claim 2 further comprising a holding capacitor having two terminals, wherein one of the terminals is connected to the connection portion, and the other of the terminals is connected to the other of the input terminals of the differential amplification circuit, and wherein the third wiring and the other of the input terminals are connected via the holding capacitor.

7. The solid state imaging device according to claim 3 further comprising a holding capacitor having two terminals, wherein one of the terminals is connected to the connection portion, and the other of the terminals is connected to the other of the input terminals of the differential amplification circuit, and wherein the third wiring and the other of the input terminals are connected via the holding capacitor.

8. The solid state imaging device according to claim 5 further comprising a switch configured to supply a predetermined potential to the other of the terminals of the holding capacitor when the switch is in an on-state,
wherein the holding capacitor and the switch form a sample-and-hold circuit that holds a reference voltage and inputs the reference voltage to the differential amplification circuit.

9. The solid state imaging device according to claim 7 further comprising a switch configured to supply a predetermined potential to the other of the terminals of the holding capacitor when the switch is in an on-state,
wherein the holding capacitor and the switch form a sample-and-hold circuit that hold a reference voltage and inputs the reference voltage to the differential amplification circuit.

10. The solid state imaging device according to claim 5 further comprising:
a first semiconductor substrate on which the plurality of pixels are arranged;
a second semiconductor substrate on which the differential amplification circuit and the holding capacitor are arranged;
a first via arranged in an electrical path between the first wiring and the one of the input terminals of the differential amplification circuit; and
a second via arranged in an electrical path between the connection portion and the one of the terminals of the holding capacitor.

11. The solid state imaging device according to claim 8 further comprising:
a first semiconductor substrate on which the plurality of pixels are arranged;
a second semiconductor substrate on which the differential amplifier circuit and the holding capacitor are arranged;
a first via arranged on an electrical path between the first wiring and the one of the input terminals of the differential amplifier circuit; and
a second via arranged on an electrical path between the connection portion and the one of the terminals of the holding capacitor.

12. The solid state imaging device according to claim 9 further comprising:
a first semiconductor substrate on which the plurality of pixels are arranged;
a second semiconductor substrate on which the differential amplifier circuit and the holding capacitor are arranged;
a first via arranged on an electrical path between the first wiring and the one of the input terminals of the differential amplifier circuit; and
a second via arranged on an electrical path between the connection portion and the one of the terminals of the holding capacitor.

13. The solid state imaging device according to claim 1 further comprising a fourth wiring that transmits the pixel signal from a second connection portion on the first wiring to the one of the input terminals of the differential amplifier circuit,
wherein the connection portion and the second connection portion are arranged in positions aligned in a second direction orthogonal to the first direction.

14. The solid state imaging device according to claim 2 further comprising a fourth wiring that transmits the pixel signal from a second connection portion on the first wiring to the one of the input terminals of the differential amplifier circuit,
wherein the connection portion and the second connection portion are arranged in positions aligned in a second direction orthogonal to the first direction.

15. The solid state imaging device according to claim 3 further comprising a fourth wiring that transmits the pixel signal from a second connection portion on the first wiring to the one of the input terminals of the differential amplifier circuit,
wherein the connection portion and the second connection portion are arranged in positions aligned in a second direction orthogonal to the first direction.

16. The solid state imaging device according to claim 12 further comprising a fourth wiring that transmits the pixel signal from a second connection portion on the first wiring to the one of the input terminals of the differential amplifier circuit,
wherein the connection portion and the second connection portion are arranged in positions aligned in a second direction orthogonal to the first direction.

17. The solid state imaging device according to claim 1 further comprising a first pad and a second pad that are connected to the second wiring,
wherein the connection portion is located on an electrical path between the first pad and the second pad.

18. The solid state imaging device according to claim 16 further comprising a first pad and a second pad that are connected to the second wiring,
wherein the connection portion is located on an electrical path between the first pad and the second pad.

19. An imaging system comprising:
the solid state imaging device according to claim 1; and a signal processing unit configured to process signals output from the plurality of pixels of the solid state imaging device.

20. A mobile apparatus comprising:

the solid state imaging device according to claim 1;

a distance information acquisition unit configured to acquire distance information of a distance to an object, from parallax images based on a signal from the solid state imaging device; and a mobile apparatus control unit configured to control the mobile apparatus based on the distance information.

* * * * *